US006930904B2

(12) United States Patent
Wu

(10) Patent No.: US 6,930,904 B2
(45) Date of Patent: Aug. 16, 2005

(54) CIRCUIT TOPOLOGY FOR HIGH-SPEED MEMORY ACCESS

(75) Inventor: Chung-Hsiao R. Wu, Sunnyvale, CA (US)

(73) Assignee: Sun Microsystems, Inc., Santa Clara, CA (US)

(*) Notice: Subject to any disclaimer, the term of this patent is extended or adjusted under 35 U.S.C. 154(b) by 156 days.

(21) Appl. No.: 10/302,341

(22) Filed: Nov. 22, 2002

(65) Prior Publication Data

US 2004/0100812 A1 May 27, 2004

(51) Int. Cl.[7] ................................................ G11C 5/06
(52) U.S. Cl. ................... 365/72; 365/230.03; 365/198
(58) Field of Search ........................ 365/72, 63, 230.03, 365/51, 198

(56) References Cited

U.S. PATENT DOCUMENTS

| | | | |
|---|---|---|---|
| 5,164,916 A | * 11/1992 | Wu et al. | 365/52 |
| 5,802,395 A | * 9/1998 | Connolly et al. | 710/14 |
| 6,049,476 A | * 4/2000 | Laudon et al. | 365/52 |
| 6,142,830 A | * 11/2000 | Loeffler | 439/620 |
| 6,172,895 B1 | * 1/2001 | Brown et al. | 365/63 |
| 6,308,232 B1 | 10/2001 | Gasbarro | |
| 6,311,310 B1 | 10/2001 | Bernstein et al. | 716/2 |
| 6,480,409 B2 | * 11/2002 | Park et al. | 365/63 |
| 6,505,331 B1 | 1/2003 | Bracha et al. | 716/12 |
| 6,567,337 B1 | 5/2003 | Sprague et al. | 365/233 |
| 2001/0050858 A1 | 12/2001 | Park et al. | |
| 2002/0024834 A1 | * 2/2002 | Jeon et al. | 365/63 |

FOREIGN PATENT DOCUMENTS

| WO | 03/079202 | 9/2003 |
|---|---|---|
| WO | 2004/010315 | 1/2004 |

* cited by examiner

*Primary Examiner*—Van Thu Nguyen
*Assistant Examiner*—J. H. Hur
(74) *Attorney, Agent, or Firm*—Meyertons Hood Kivlin Kowert & Goetzel, P.C.; B. Noël Kivlin; Erik A. Heter

(57) ABSTRACT

A circuit topology for high-speed memory access. In one embodiment, an electronic circuit includes a memory controller. The memory controller is coupled to a memory module by a first plurality of transmission lines. The memory module may include a second plurality of transmission lines coupled to the first plurality. The memory module further includes a first memory bank coupled to the second plurality of transmission lines and a third plurality of transmission lines. A second memory bank may be coupled to the third plurality of transmission lines. Each of the first, second, and third pluralities of transmission lines may be part of a common bus.

14 Claims, 7 Drawing Sheets

CIRCUIT TOPOLOGY FOR HIGH-SPEED MEMORY ACCESS

BACKGROUND OF THE INVENTION

1. Field of the Invention

This invention relates to computer systems, and more particularly, to a circuit topology for supporting the routing of signals to memory devices.

2. Description of the Related Art

The demand for increased computing power in computer systems is ever increasing. Such demands include the demand for faster processors, additional memory, and faster system boards. The demand for faster processors and system boards often times results in the need for faster clock speeds.

As clock speeds increase, the effects of loading may become more significant in the distribution of clock signals. FIGS. 1A and 1B each illustrate a typical circuit topology for clock distribution. In each of the embodiments shown, a memory controller 2 having a phase-locked loop (10) distributes the differential clock signal to DIMM (dual inline memory module) 20 via a point-to-point connection. Additional memory modules may be coupled to the memory controller in the same manner using separate pairs of transmission lines. Each DIMM 20 may include a resistor that is electrically coupled between the transmission lines. Thus, for each DIMM slot on the board, a separate pair of transmission lines may be required. One possible solution to this problem is to use the same pair of transmission lines for each of the DIMMs. However, if a single pair of transmission lines were used, the resistance between each transmission line of the pair would vary with the DIMM population due to the parallel connection of the termination resistors (for the embodiment shown in FIG. 1A), and hence the loading might also vary. Such a configuration could potentially lead to timing mismatches and possibly limit the maximum clock speed at which the system board upon which the DIMMs are implemented may operate.

Higher operating speeds may also subject address signals and data signals to more pronounced loading effects. FIG. 1A illustrates one circuit topology used to couple a data line from a memory controller to memory banks of a DIMM (dual-inline memory module). In the embodiment shown, transmission line L_lead-in is coupled to a first connector, while a second transmission line segment couples the first connector to a second connector. The second connector is coupled to a termination resistor $R_T$ by a third transmission line segment. The memory banks of each DIMM are coupled to the connectors by a pair of transmission line stubs with a damping resistor $R_D$ between them. Signals transmitted between the memory controller and the memory banks may be affected by parasitic inductances in the transmission lines. In particular, parasitic inductances L_stub1 and L_stub2 in the transmission line stubs of each DIMM may cause signal reflections. While the damping resistors $R_D$ and $R_T$ may absorb some of the energy, some reflected energy may still remain in the various transmission line segments. The presence of such reflected energy may limit the maximum clock speed of the memory, and thus the maximum data rate on the data bus.

FIG. 1B illustrates an alternate configuration which uses on-die termination (ODT) instead of a termination resistor $R_T$ as in the embodiment of FIG. 1A. The ODT within each memory bank (or memory chip within each bank) may eliminate the need for a termination resistor $R_T$ to be associated with each data line (or address line). However, ODT may require extra control lines between the memory controller and the individual die of the memory banks. Despite the ODT, some reflected energy may remain in the various transmission line segments. As with the embodiment shown in FIG. 1A, damping resistors may be used to absorb the reflected energy. However, the damping resistors may not be able to absorb all of the reflected energy, and thus the maximum data rate may still be limited despite any improvement over the embodiment of FIG. 1A.

SUMMARY OF THE INVENTION

A circuit topology for high-speed memory access is disclosed. In one embodiment, an electronic circuit includes a memory controller. The memory controller is coupled to a memory module by a first plurality of transmission lines. The memory module may include a second plurality of transmission lines coupled to the first plurality. The memory module further includes a first memory bank coupled to the second plurality of transmission lines and a third plurality of transmission lines. A second memory bank may be coupled to the third plurality of transmission lines. Each of the first, second, and third pluralities of transmission lines may be part of a common bus.

BRIEF DESCRIPTION OF THE DRAWINGS

Other aspects of the invention will become apparent upon reading the following detailed description and upon reference to the accompanying drawings in which.

Figure 1A:
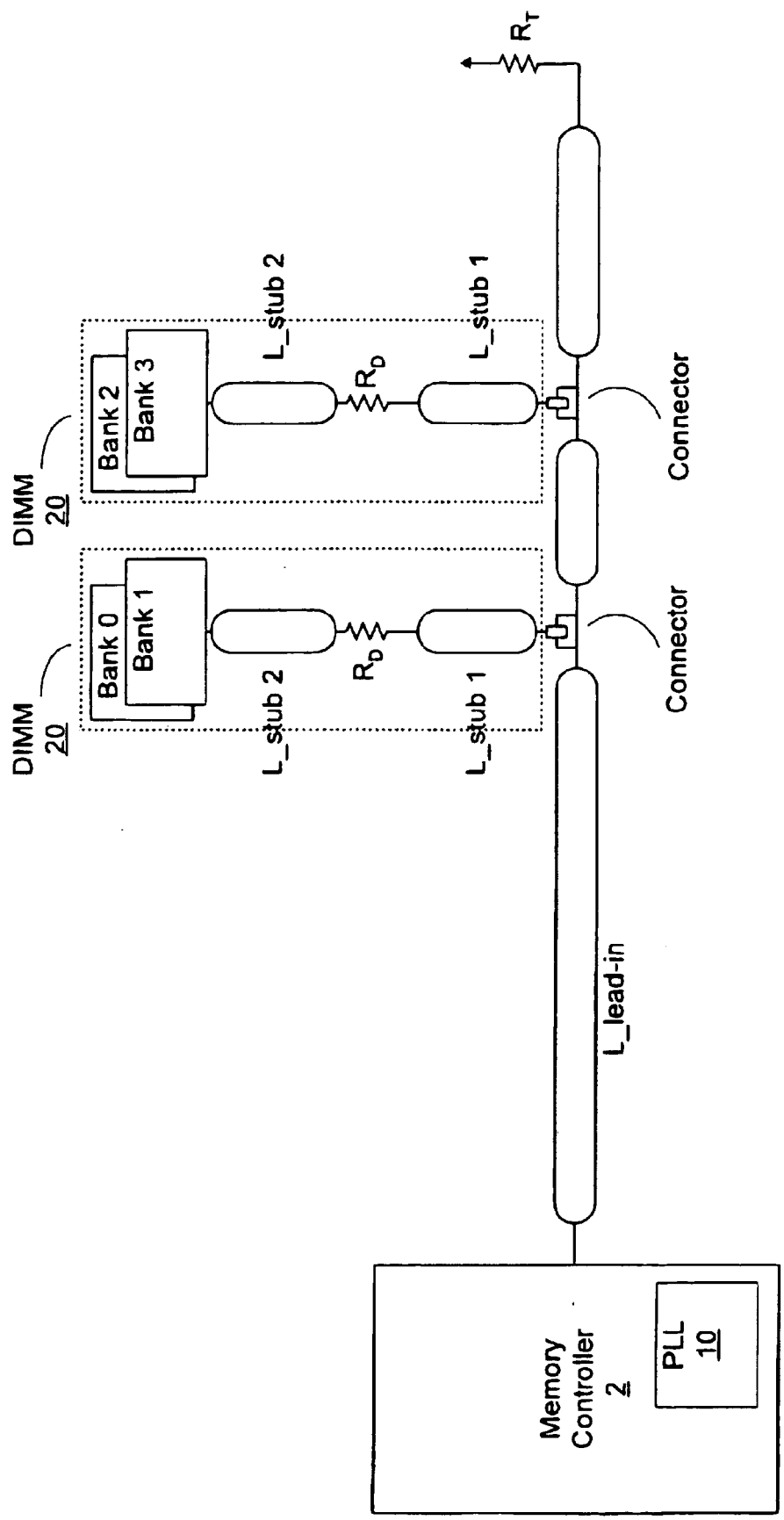
FIG. 1A (Prior Art) is a diagram illustrating one embodiment of a circuit topology coupling a memory controller to a plurality of memory banks.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling with the spirit and scope of the present invention as defined by the appended claims.

DETAILED DESCRIPTION OF THE INVENTION

Figure 2:
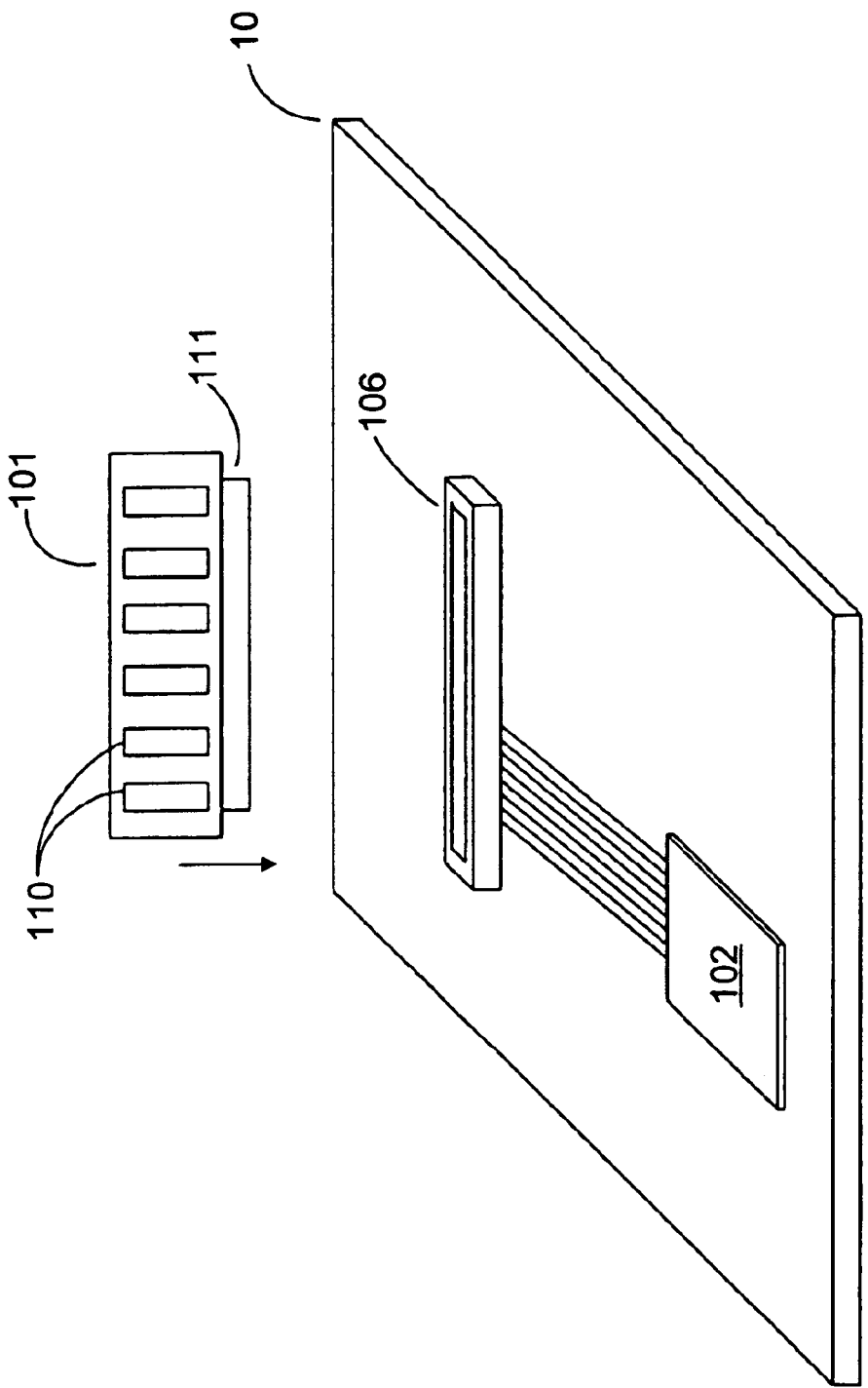
FIG. 2 is a perspective view of one embodiment of a printed circuit board having a connector for mounting a memory module.

Turning now to FIG. 2, a perspective view of one embodiment of a printed circuit board (PCB) having a connector for mounting a memory module is shown. In the embodiment shown, PCB 10 may include a memory controller 102 coupled to a connector 106 by a plurality of transmission lines. The transmission lines may be circuit traces on or within PCB 10 or any other type of transmission medium. The transmission lines may also be virtually any type of transmission line configuration.

Connector 106 may be configured for receiving a memory module, such as memory module 101. Memory module 101 may include an edge connector configured for insertion into connector 106 as shown in this embodiment. However, other types of connectors are possible and contemplated for both memory module 101 and PCB 10. Memory module also includes a plurality of memory chips 110 which may be used to form a plurality of memory banks.

Figure 3:
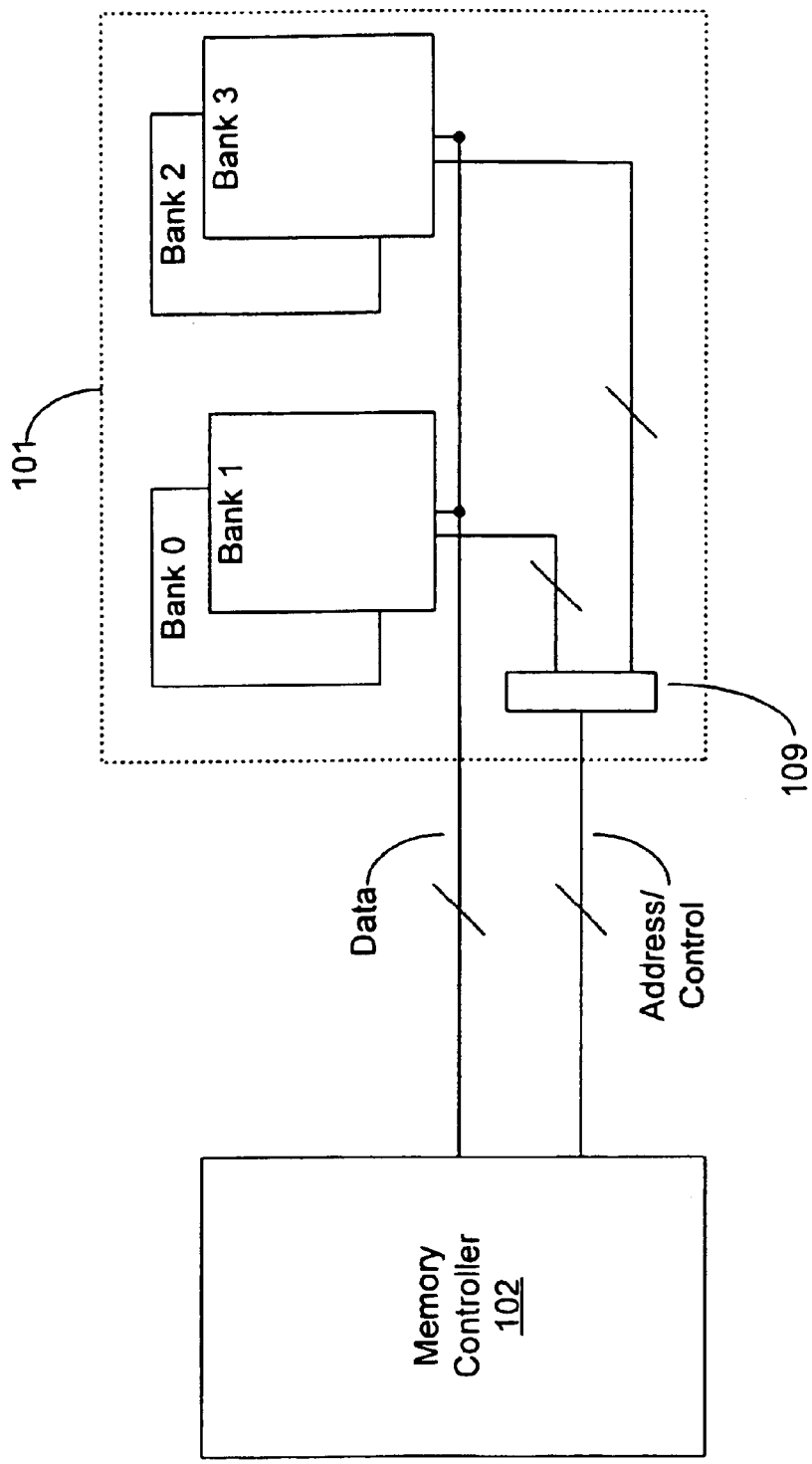
FIG. 3 is a block diagram of one embodiment of a memory subsystem.

Turning now to FIG. 3, a block diagram of one embodiment of a memory subsystem is shown. In the embodiment shown, memory controller 102 is coupled to memory module 101 by a plurality of data lines and a plurality of address/control lines.

Memory controller 102 may be virtually any type of circuit that provides memory control functions. In one embodiment, memory controller 102 is an integrated circuit designed exclusively to perform memory control functions. In another embodiment, memory controller 102 is part of a processor having memory control functions. In yet another embodiment, memory controller 102 is a general-purpose processor executing instructions for providing memory control functions. In general, memory controller 102 may be any device (or a part of any device) coupled to a memory bus and able to read and/or write data from system memory.

In the embodiment shown, memory module 101 may include four memory banks: bank 0, bank 1, bank 2 and bank 3. Other embodiments may have a greater or lesser number of memory banks. With respect to the data bus, the memory banks may be connected in a daisy chain topology, which will be described in further detail below. Memory module 101 may also be coupled to receive address and control signals from memory controller 102. In the embodiment shown, buffer circuit 109 of memory module 101 is coupled to receive address and control signals from memory controller 102, and further coupled to provide address and control signals to each of the memory banks. Buffer circuit 109 may be a typical line driver chip, a register, or any other type of circuit that may perform a buffering function for the address and control signals.

Figure 4A:
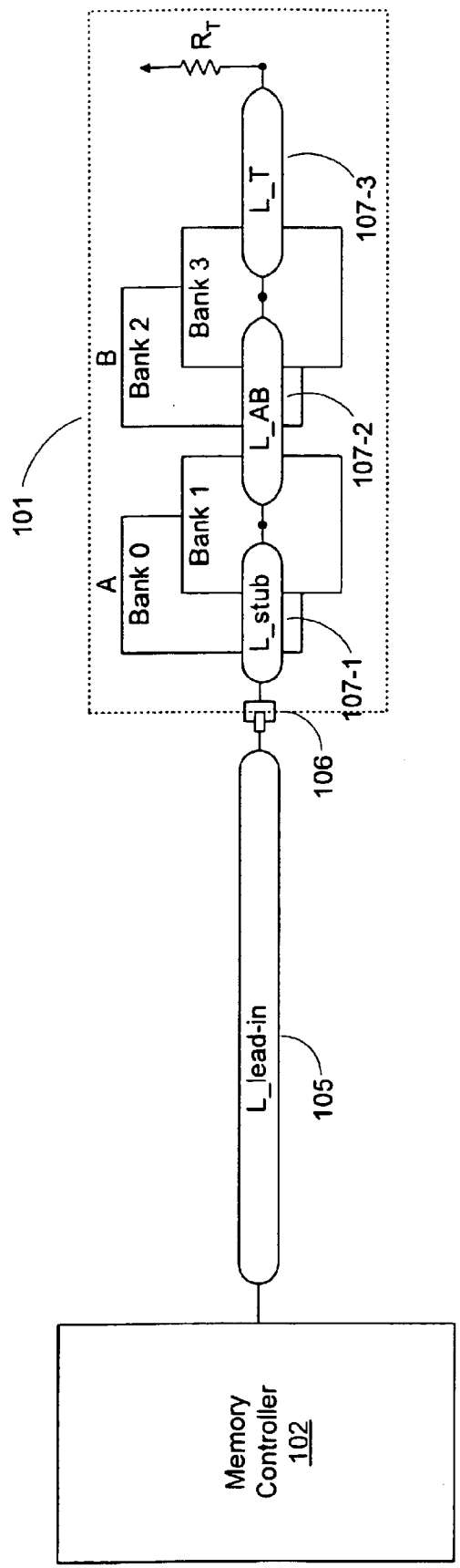
FIG. 4A is a diagram of one embodiment of a circuit topology for coupling a data bus between a memory controller and a plurality of memory banks.

Moving now to FIG. 4A, a diagram of one embodiment of a circuit topology for coupling a data bus between a memory controller and a plurality of memory banks is illustrated. In this particular drawing, the coupling of a single signal path (e.g. a data line of a data bus) from the memory controller to both memory banks. Each signal path may include pluralities of data lines which couple the memory controller, the connector, memory banks, and termination resistors. As shown in this embodiment, the memory banks may be coupled in a daisy chain topology.

Memory controller 102 may be coupled to memory module 101 by transmission line 105 (L_lead-in). Transmission line 105 may be one of a plurality of transmission lines, and may be part of a bus, such as a data bus including a plurality of data lines. Furthermore, transmission line 105 may be a signal trace on a signal layer of a printed circuit board (either an outer layer or an internal layer). Memory module 101 may be coupled to transmission line 105 by connector 106.

Connector 106 may couple transmission line 105 to a first pair of memory banks, bank 0 and bank 1 (collectively labeled 'A' here), via transmission stub 107-1 (L_stub). As with transmission line 105, transmission stub 107-1 may be one of a plurality of transmission stubs that form a portion of a bus such as a data bus. Each of transmission stubs 107-1 may be coupled through connector 106 to one of transmission lines 105, thereby forming a data path between memory controller 102 and memory banks 0 and 1. A data I/O pin for a memory chip in bank 0 as well as a data I/O pin for a memory chip in bank 1 may be coupled to transmission stub 107-1.

Memory banks 2 and 3 (group 'B') may be coupled to memory banks 0 and 1 by transmission stub 107-2 (L_AB). Transmission stub 107-2 may be one of a plurality of transmission stubs forming signal paths between the memory banks of group A and the memory banks of group B. Thus, transmission stub 107-2 may provide a signal connection to the bus for a data I/O pin of a memory chip in bank 2 and a memory chip in bank 3. In essences, transmission stub 107-2 provides a link in the chain for the daisy chain topology by which the memory banks are arranged and connected to the data bus.

Figure 1B:
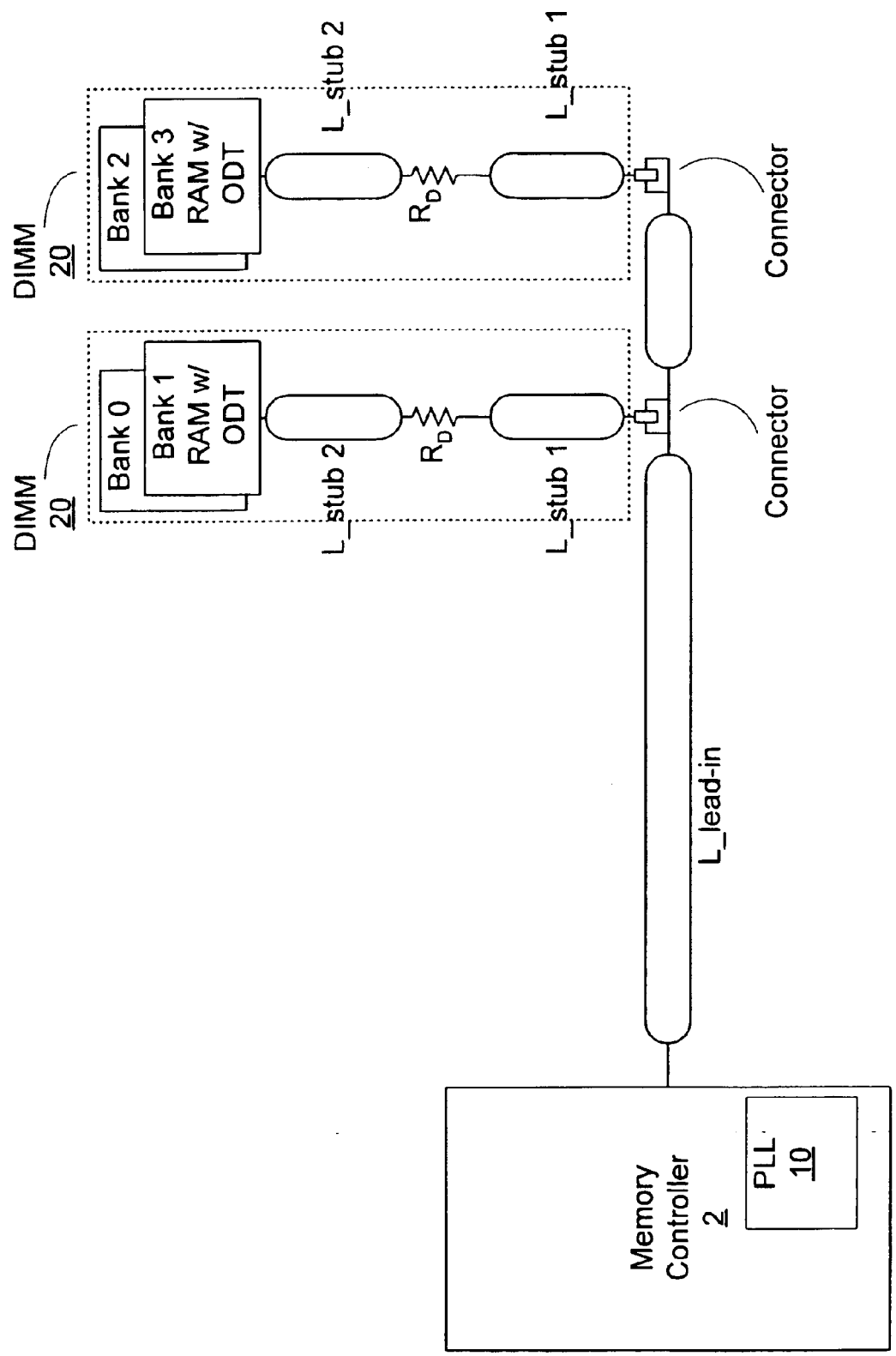
FIG. 1B (Prior Art) is a diagram illustrating another embodiment of a circuit topology coupling a memory controller to a plurality of memory banks.

Each signal line in the bus may be terminated by a termination resistor $R_T$. In the embodiment shown, transmission stub 107-3 (L_T) couples memory banks 2 and 3 (and thus transmission stub 107-2) to termination resistor $R_T$. As with transmission stubs 107-2, 107-1, and transmission line 105, transmission stub 107-3 may be one of a plurality of transmission stubs. Each of the plurality of transmission stubs of which transmission stub 107-3 is a part may be used, in combination with a termination resistor $R_T$, to terminate a signal line of the bus. Termination resistor $R_T$ may be coupled to a power plane or a reference plane in order to provide the termination. Terminating each signal line of the bus may minimize the occurrence of signal reflections on the signal lines of the bus, if not eliminating them. Termination resistor $R_T$ may also absorb some of the energy of those signal reflections that do occur, thereby reducing their amplitude. In general, effective termination of each signal line and the resulting reduction of signal reflections may allow the memory subsystem to operate at higher speeds. The daisy chain topology by which the memory banks are connected may also reduce or eliminate the need for damping resistors, as shown in FIG. 1A, or on-die termination (which requires extra control lines) as shown in FIG. 1B.

It should be noted here that the terms transmission 'stub' and transmission 'line' mean essentially the same thing, although the term 'stub' is used in this particular example to denote shorter transmission lines on a memory module.

Figure 4B:
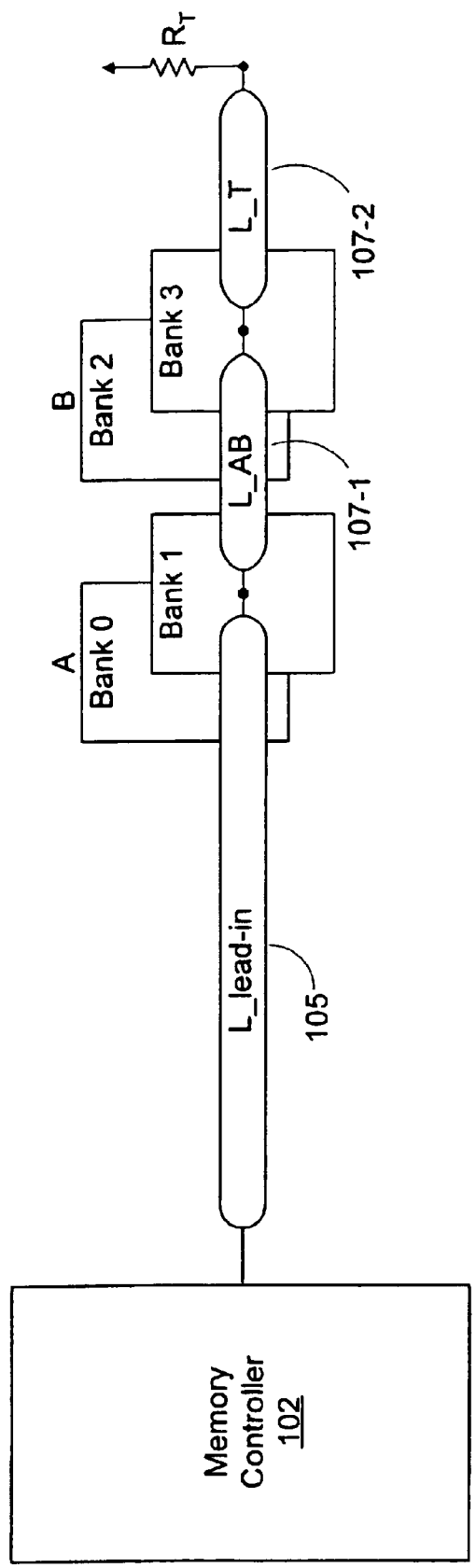
FIG. 4B is a diagram of another embodiment of a circuit topology for coupling a data bus between a memory controller and a plurality of memory banks.

FIG. 4B is a diagram of another embodiment of a circuit topology for coupling a data bus between a memory controller and a plurality of memory banks. The embodiment shown in FIG. 4B is essentially the same as the embodiment of FIG. 4A, however, the memory chips of each memory bank in this embodiment may be mounted directly to the PCB upon which memory controller 102 is mounted. This may eliminate the need for a connector, as well as reducing the number of transmission line segments necessary.

Figure 5:
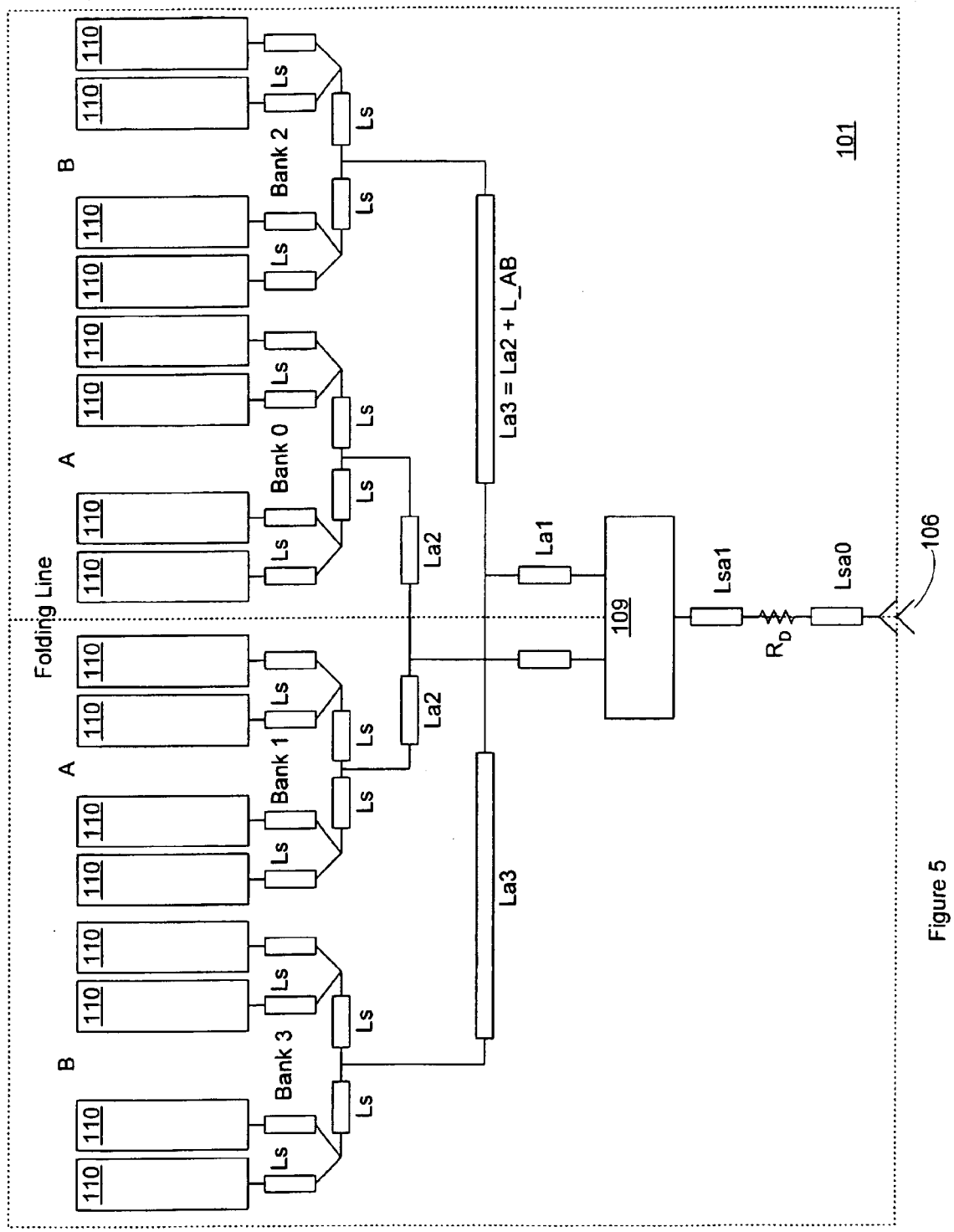
FIG. 5 is a diagram of one embodiment of a circuit topology for coupling address and control signals between a memory controller and a plurality of memory banks.

FIG. 5 is a diagram of one embodiment of a circuit topology for coupling address and control signals on a memory module to a plurality of memory banks. The signal paths represented here are examples of a plurality of signal paths that may be present in various embodiments, and may be used to convey signals such as address signals and control signals to a plurality of memory chips in various memory banks.

In the embodiment shown, memory module 101 may receive a control/address signal from a transmission line on a printed circuit board through connector 106. A pair of transmission stubs Lsa0 and Lsa1 may provide a signal path to buffer circuit 109, with damping resistor $R_D$ arranged in between them. The damping resistor may absorb energy produced by signal reflections.

Buffer circuit 109 may be a standard buffer/line driver chip, a register, or any other type of circuit which may be able to provide drive strength to address and/or control signals. In one embodiment, buffer circuit 109 may be a register which may include storage for a state of a received address or control signal, and may drive this state to a memory bank upon which operations (e.g. reads and writes) are performed.

Buffer circuit 109 may convey a signal to the memory chips group A (banks 0 and 1) through the transmission stubs labeled La2 and Ls. In this particular embodiment, a signal conveyed to the memory chips of group A will be received by a pin of each of the memory chips 110. For group B, buffer circuit 109 may convey signals to its memory chips 110 through transmission stubs La3 and Ls. The length of transmission stub La3 may be such that it is approximately equal to the sum of transmission stubs La2 and L_AB as shown in FIGS. 4A and/or 4B (i.e. La3=La2+L_AB). Thus, La3 may be compensated to allow for sufficient timing margins for memory accesses to group B (banks 2 and 3 in this example).

The physical arrangement of one embodiment of memory module 101 may also be noted from FIG. 5. The line labeled as "Folding Line" in the drawing may represent a dividing line between a first side and an opposite second side of the memory module. Buffer circuit 109, which is shown here as straddling the folding line may actually be on either side of the folding line, or may be divided into separate units for each side of the memory module. Connector 106 may be coupled to the edge of memory module denoted by the folding line. Thus, the physical arrangement of the memory module as shown in FIGS. 3 and 4A is evident here.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. An electronic circuit comprising:
   a memory controller mounted on a printed circuit board (PCB) having a first plurality of transmission lines;
   a memory module, the memory module coupled to the memory controller by the first plurality of transmission lines, wherein the memory module includes:
   a first memory bank coupled to the first plurality of transmission lines by a second plurality of transmission lines, wherein the first plurality of transmission lines is coupled to the second plurality of transmission lines by a connector;
   a second memory bank coupled to the first memory bank by a third plurality of transmission lines;
   a fourth plurality of transmission lines coupled to the second memory bank, wherein each of the fourth plurality of transmission lines is terminated with a resistor; and
   a buffer circuit, and wherein each of the plurality of control lines and each of the plurality of address lines is coupled between the connector and the buffer circuit by a first pair of transmission stubs and a damping resistor between each of the first pair of transmission stubs, wherein the buffer circuit is coupled to the first memory bank by a second pair and a third pair of transmission stubs, wherein each of the third pair of transmission stubs is coupled to a pin of a first memory chip;
   wherein the PCB and the memory module each include a plurality of control lines and a plurality of address lines, wherein each of the control and address lines is coupled between the memory controller and the memory module, wherein each of the plurality of control lines and plurality of address lines of the PCB is coupled to one of the plurality of control lines and one of the plurality of address lines on the memory module by the connector; and
   wherein each of the first, second, and third plurality of transmission lines is part of a bus.

2. The electronic circuit as recited in claim 1, wherein the bus is a data bus, and wherein each of the first plurality, second plurality, and third plurality of transmission lines are data lines.

3. The electronic circuit as recited in claim 2, wherein each of the fourth plurality of transmission lines terminates one of the data lines.

4. The electronic circuit as recited in claim 1, wherein the buffer circuit is coupled to the second memory bank by a fourth pair and a fifth pair of transmission stubs, and wherein each of the fifth pair of transmission stubs is coupled to a pin of a second memory chip.

5. The electronic circuit as recited in claim 1, wherein the memory module further includes a third memory bank coupled to the second and third plurality of transmission lines and a fourth memory bank coupled to the third and fourth plurality of transmission lines.

6. The electronic circuit as recited in claim 5, wherein each of the first, second, third, and fourth memory banks includes a plurality of memory chips.

7. The electronic circuit as recited in claim 1, wherein the memory module is a DIMM (dual inline memory module).

8. A method comprising:
   providing a memory controller mounted on a printed circuit board (PCB) having a first plurality of transmission lines;
   coupling a memory module to the memory controller with the first plurality of transmission lines, wherein the memory module includes:
   a first memory bank coupled to the first plurality of transmission lines by a second plurality of transmission lines, wherein the first plurality of transmission lines is coupled to the second plurality of transmission lines by a connector.;
   a second memory bank coupled to the first memory bank by a third plurality of transmission lines;
   a fourth plurality of transmission lines to the second memory bank, wherein each of the fourth plurality of transmission lines is terminated with a resistor; and
   a buffer circuit, and wherein each of the plurality of control lines and each of the plurality of address lines is coupled between the connector and the buffer circuit by a first pair of transmission stubs and a damping resistor between each of the first pair of transmission stubs, wherein the buffer circuit is coupled to the first memory bank by a second pair and a third pair of transmission stubs, wherein each of the third pair of transmission stubs is coupled to a pin of a first memory chip;

wherein the PCB and the memory module each include a plurality of control lines and a plurality of address lines, wherein each of the control and address lines is coupled between the memory controller and the memory module, wherein each of the plurality of control lines and plurality of address lines of the PCB is coupled to one of the plurality of control lines and one of the plurality of address lines on the memory module by the connector;

wherein each of the first, second, and third plurality of transmission lines is part of a bus.

9. The method as recited in claim 8, wherein the bus is a data bus, and wherein each of the first plurality, second plurality, and third plurality of transmission lines are data lines.

10. The method as recited in claim 9, wherein each of the fourth plurality of transmission lines terminates one of the data lines.

11. The method as recited in claim 8, wherein the buffer circuit is coupled to the second memory bank by a fourth pair and a fifth pair of transmission stubs, and wherein each of the fifth pair of transmission stubs is coupled to a pin of a second memory chip.

12. The method as recited in claim 8, wherein the memory module further includes a third memory bank coupled to the second and third plurality of transmission lines and a fourth memory bank coupled to the third and fourth plurality of transmission lines.

13. The method as recited in claim 12, wherein each of the first, second, third, and fourth memory banks includes a plurality of memory chips.

14. The method as recited in claim 8, wherein the memory module is a DIMM (dual inline memory module).

* * * * *